US009131634B2

(12) United States Patent
Hadjichristos et al.

(10) Patent No.: US 9,131,634 B2
(45) Date of Patent: Sep. 8, 2015

(54) RADIO FREQUENCY PACKAGE ON PACKAGE CIRCUIT

(71) Applicant: QUALCOMM Incorporated, San Diego, CA (US)

(72) Inventors: Aristotele Hadjichristos, San Diego, CA (US); Gurkanwal Singh Sahota, San Diego, CA (US); Steven C Ciccarelli, San Diego, CA (US); David J Wilding, San Diego, CA (US); Ryan D Lane, San Diego, CA (US); Christian Holenstein, La Mesa, CA (US); Milind P Shah, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 260 days.

(21) Appl. No.: 13/677,054

(22) Filed: Nov. 14, 2012

(65) Prior Publication Data
US 2013/0122833 A1    May 16, 2013

Related U.S. Application Data

(60) Provisional application No. 61/560,157, filed on Nov. 15, 2011.

(51) Int. Cl.
*H04B 5/00* (2006.01)
*H05K 3/36* (2006.01)
*H04B 1/40* (2015.01)
*H05K 13/04* (2006.01)
*H01L 23/66* (2006.01)
*H01L 25/16* (2006.01)

(52) U.S. Cl.
CPC ........... *H05K 3/368* (2013.01); *H01L 23/66* (2013.01); *H01L 25/16* (2013.01); *H04B 1/40* (2013.01); *H05K 13/0465* (2013.01); *H01L 2224/16225* (2013.01); *H01L 2924/1461* (2013.01); *H01L 2924/15311* (2013.01); *H01L 2924/15321* (2013.01); *Y10T 29/49126* (2015.01); *Y10T 29/5317* (2015.01)

(58) Field of Classification Search
CPC ........................ H05K 3/368; H05K 13/0465
USPC .............................. 455/90.2, 67.11, 286, 41.1
See application file for complete search history.

(56) References Cited

U.S. PATENT DOCUMENTS

| | | | |
|---|---|---|---|
| 6,150,724 A | 11/2000 | Wenzel et al. | |
| 7,239,020 B2 | 7/2007 | Morkner | |
| 7,772,708 B2 | 8/2010 | Leddige et al. | |
| 2006/0255446 A1 | 11/2006 | Wehrly, Jr. | |
| 2007/0096160 A1 | 5/2007 | Beroz et al. | |
| 2008/0111226 A1 | 5/2008 | White et al. | |
| 2009/0160430 A1* | 6/2009 | Brown et al. ............ | 324/76.23 |
| 2011/0128713 A1 | 6/2011 | Kawano et al. | |

FOREIGN PATENT DOCUMENTS

| | | |
|---|---|---|
| EP | 1326303 A2 | 7/2003 |
| JP | 59172271 A | 9/1984 |

OTHER PUBLICATIONS

International Search Report and Written Opinion—PCT/US2012/065363—ISA/EPO—Mar. 6, 2013.

* cited by examiner

*Primary Examiner* — Eugene Yun

(57) ABSTRACT

A radio frequency package on package (PoP) circuit is described. The radio frequency package on package (PoP) circuit includes a first radio frequency package. The first radio frequency package includes radio frequency components. The radio frequency package on package (PoP) circuit also includes a second radio frequency package. The second radio frequency package includes radio frequency components. The first radio frequency package and the second radio frequency package are in a vertical configuration. The radio frequency components on the first radio frequency package are designed to reduce the effects of ground inductance.

53 Claims, 10 Drawing Sheets

RADIO FREQUENCY PACKAGE ON PACKAGE CIRCUIT

RELATED APPLICATIONS AND PRIORITY CLAIM

This application is related to and claims priority from U.S. Provisional Patent Application Ser. No. 61/560,157, filed Nov. 15, 2011, for "RADIO FREQUENCY PACKAGE ON PACKAGE (POP)," which is incorporated herein by reference.

TECHNICAL FIELD

The present disclosure relates generally to wireless devices for communication systems. More specifically, the present disclosure relates to systems and methods for generating a radio frequency package on package (PoP) circuit.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

As electronic and wireless devices become more advanced, the amount of space available for circuitry decreases. Attempts to combine or consolidate components on a single circuit within a wireless device may result in a larger footprint on the circuit, and may include additional considerations for functionality. Benefits may be realized by improvements to electronic devices that allow complex circuitry to fit within a smaller space.

SUMMARY

A radio frequency package on package (PoP) circuit is described. The radio frequency package on package (PoP) circuit includes a first radio frequency package. The first radio frequency package includes radio frequency components. The radio frequency package on package (PoP) circuit also includes a second radio frequency package. The second radio frequency package includes radio frequency components. The first radio frequency package and the second radio frequency package are in a vertical configuration. The radio frequency components on the first radio frequency package are designed to reduce the effects of ground inductance.

The first radio frequency package may include passive or active radio frequency components. Each of the radio frequency components on the first radio frequency package may be passive or active radio frequency components. The second radio frequency package may include passive or active radio frequency components. Each of the radio frequency components on the second radio frequency package may be passive or active components. The radio frequency package on package circuit may be implemented in a front end circuit of a wireless device.

The radio frequency components on the first radio frequency package and the second radio frequency package may be designed according to a desired thickness of the radio frequency package on package circuit. The desired thickness may be equal to or less than 1 millimeter (mm) Back grinding may be performed on one or more of the radio frequency components of one of the first radio frequency package and the second radio frequency package. The back grinding may be performed according to the desired thickness of the radio frequency package on package (PoP) circuit.

The first radio frequency package or second radio frequency package may include one or more filters. The first radio frequency package or second radio frequency package may include one or more power amplifiers. At least one of the filters may be a surface acoustic wave (SAW) filter or a bulk acoustic wave (BAW) filter. The first radio frequency package may include one or more filters, duplexers, low noise amplifiers and switches. The second radio frequency package may include one or more antenna switches and power amplifiers.

The first radio frequency package and the second radio frequency package may be coupled using multiple interconnects. The multiple interconnects may include soldering balls. The multiple interconnects may include vias. One or more radio frequency components on the first radio frequency package may be electrically coupled to at least one radio frequency component on the second radio frequency package via the multiple interconnects.

A method of generating a radio frequency package on package (PoP) circuit is also described. The method includes obtaining a first radio frequency package. The first radio frequency package includes radio frequency components. The method also includes obtaining a second radio frequency package. The second radio frequency package includes radio frequency components. The radio frequency components on the first radio frequency package are designed to reduce the effects of ground inductance. The method also includes connecting the first radio frequency package to the second radio frequency package in a vertical configuration.

An apparatus for generating a radio frequency package on package (PoP) circuit is also described. The apparatus includes means for obtaining a first radio frequency package. The first radio frequency package includes radio frequency components. The apparatus also includes means for obtaining a second radio frequency package. The second radio frequency package includes radio frequency components. The radio frequency components on the first radio frequency package are designed to reduce the effects of ground inductance. The apparatus also includes means for connecting the first radio frequency package to the second radio frequency package in a vertical configuration.

A computer-program product for generating a radio frequency package on package (PoP) circuit is also described. The computer-program product includes a non-transitory computer-readable medium having instructions thereon. The instructions include code for causing an apparatus to obtain a first radio frequency package. The first radio frequency package includes radio frequency components. The instructions also include code for causing the apparatus to obtain a second radio frequency package. The second radio frequency package includes radio frequency components. The radio frequency components on the first radio frequency package are designed to reduce the effects of ground inductance. The instructions also include code for causing the apparatus to connect the first radio frequency package to the second radio frequency package in a vertical configuration.

DETAILED DESCRIPTION

Figure 1:
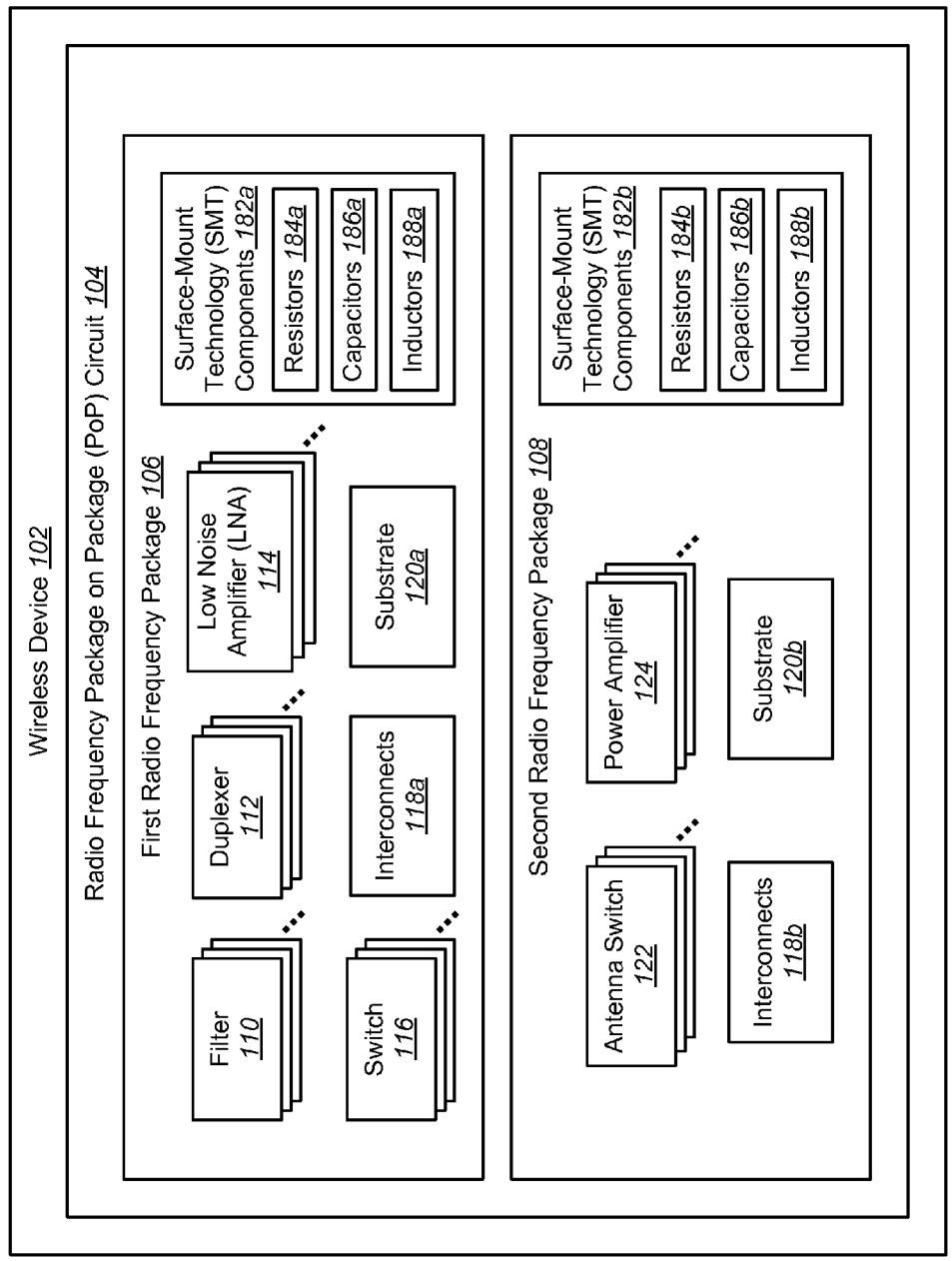
FIG. 1 is a block diagram illustrating a radio frequency package on package (PoP) circuit implemented on a wireless device.

FIG. 1 is a block diagram illustrating a radio frequency package on package (PoP) circuit 104 implemented on a wireless device 102. Package on package (PoP) circuits are multiple discrete circuits that are packaged using a vertical configuration. For example, a package on package (PoP) circuit may include two or more packages that are installed on top of each other with an interface or interconnection for routing signals between the packages. The packages that make up a package on package (PoP) circuit may include multiple discrete circuits from different sources. In this way, a package on package (PoP) circuit may be assembled using different circuits from different manufacturers. A radio frequency package on package (PoP) circuit 104 may include one or more radio frequency packages 106, 108 with radio frequency components that are packaged together using a vertical configuration.

The radio frequency package on package (PoP) circuit 104 may be implemented on a wireless device 102. The radio frequency package on package (PoP) circuit 104 includes a first radio frequency package 106 and a second radio frequency package 108. The first radio frequency package 106 and the second radio frequency package 108 may include radio frequency components that are used by the wireless device 102. The first radio frequency package 106 and the second radio frequency package 108 may be vertically oriented such that the first radio frequency package 106 is physically on top of the second radio frequency package 108. Alternatively, the second radio frequency package 108 may be on top of the first radio frequency package 106.

The wireless device 102 may be a wireless communication device or a base station. A wireless communication device may also be referred to as, and may include some or all of the functionality of, a terminal, an access terminal, a user equipment (UE), a subscriber unit, a station, etc. A wireless communication device may be a cellular phone, a personal digital assistant (PDA), a wireless device, a wireless modem, a handheld device, a laptop computer, a PC card, compact flash, an external or internal modem, a wireline phone, etc. A wireless communication device may be mobile or stationary. A wireless communication device may communicate with zero, one or multiple base stations on a downlink and/or an uplink at any given moment. The downlink (or forward link) refers to the communication link from a base station to a wireless communication device, and the uplink (or reverse link) refers to the communication link from a wireless communication device to a base station. Uplink and downlink may refer to the communication link or to the carriers used for the communication link.

A wireless device may operate in a wireless communication system that includes other wireless devices, such as base stations. A base station is a station that communicates with one or more wireless communication devices. A base station may also be referred to as, and may include some or all of the functionality of, an access point, a broadcast transmitter, a Node B, an evolved Node B, etc. Each base station provides communication coverage for a particular geographic area. A base station may provide communication coverage for one or more wireless communication devices. The term "cell" can refer to a base station and/or its coverage area, depending on the context in which the term is used.

Communication in a wireless communication system (e.g., a multiple-access system) may be achieved through transmissions over a wireless link. Such a communication link may be established via a single-input and single-output (SISO) or a multiple-input and multiple-output (MIMO) system. A multiple-input and multiple-output (MIMO) system includes transmitter(s) and receiver(s) equipped, respectively, with multiple (NT) transmit antennas and multiple (NR) receive antennas for data transmission. SISO systems are particular instances of a multiple-input and multiple-output (MIMO) system. The multiple-input and multiple-output (MIMO) system can provide improved performance (e.g., higher throughput, greater capacity or improved reliability) if the additional dimensionalities created by the multiple transmit and receive antennas are utilized. Further examples of wireless communications systems may include Wi-Fi or Bluetooth technologies.

The wireless communication system may utilize both single-input and multiple-output (SIMO) and multiple-input and multiple-output (MIMO). The wireless communication system may be a multiple-access system capable of supporting communication with multiple wireless communication devices by sharing the available system resources (e.g., bandwidth and transmit power). Examples of such multiple-access systems include code division multiple access (CDMA) systems, wideband code division multiple access (W-CDMA) systems, time division multiple access (TDMA) systems, frequency division multiple access (FDMA) systems, orthogonal frequency division multiple access (OFDMA) systems, single-carrier frequency division multiple access (SC-FDMA) systems, 3rd Generation Partnership Project (3GPP) Long Term Evolution (LTE) systems and spatial division multiple access (SDMA) systems.

The radio frequency package on package (PoP) circuit 104 may be implemented as part of the front end circuitry of the wireless device 102. Front end circuitry may refer to all circuitry between an antenna and a first intermediate frequency (IF) stage (e.g., a frequency downconversion stage) on the wireless device 102. Front end circuitry may be implemented on a printed circuit board (PCB), a radio frequency integrated circuit (RFIC), on a substrate, such as silicon, or on another medium on which front end circuitry may be implemented. As used herein, radio frequency components may refer to circuitry and other components used as part of the front end circuitry of the wireless device 102. In implementing the radio frequency components on the radio frequency package on package (PoP) circuit 104, various considerations, such as isolation and insertion loss performance may be considered.

A first radio frequency package 106 on the radio frequency package on package (PoP) circuit 104 may include various radio frequency components. For example, the first radio frequency package 106 may include one or more filters 110. Different types of filters 110 may include bandpass filters, low pass filters, high pass filters, tunable filters, surface acoustic wave (SAW) filters and bulk acoustic wave (BAW) filters. A bandpass filter, low pass filter, high pass filter and tunable filter may be implemented using microelectromechanical system (MEMS), silicon or other materials. In some configurations, the filters 110 (e.g., surface acoustic wave (SAW) or bulk acoustic wave (BAW) filters) may be implemented using piezoelectric materials. The first radio frequency package 106 may implement a combination of different kinds of filters.

The first radio frequency package 106 may also include one or more low noise amplifiers (LNAs) 114 and/or switches 116 (e.g., radio frequency switches). Different types of low noise amplifiers (LNAs) 114 may include distributed gain low noise amplifiers (LNAs), tunable low noise amplifiers (LNAs), low gain low noise amplifiers (LNAs) and high gain low noise amplifiers (LNAs). Each of the low noise amplifiers (LNAs) 114 may be used for amplifying a signal (e.g., a filtered signal). Each of the low noise amplifiers (LNAs) 114 may be coupled to one or more radio frequency components on the radio frequency package on package (PoP) circuit 104. Further, one or more switches 116 may be implemented on the first radio frequency package 106 to provide switching capabilities between radio frequency components on the radio frequency package on package (PoP) circuit 104. The switches 116 may provide multiple filter receive outputs. In some configurations, the first radio frequency package 106 may use a low noise amplifier (LNA) 114, switch 116 or nothing in its place.

The first radio frequency package 106 may also include one or more duplexers 112. The duplexers 112 may be implemented using microelectromechanical systems (MEMS), surface acoustic wave (SAW) technology, bulk acoustic wave (BAW) technology, etc. The duplexers 112 may allow bi-directional communication between radio frequency components on the radio frequency package on package (PoP) circuit 104. One or more duplexers 112 may be coupled to one or more antennas for rejecting noise, rejecting undesired interfering signals and otherwise duplexing a signal passing through the radio frequency package on package (PoP) circuit 104.

The first radio frequency package 106 may also include surface mount technology (SMT) components 182a, including resistors 184a, capacitors 186a and inductors 188a. The surface mount technology (SMT) components 182a may be used to optimize the filters 110, low noise amplifiers (LNAs) 114 and other radio frequency components on the radio frequency package on package (PoP) circuit 104. The surface mount technology (SMT) components 182a may also be used to operate or interface with any internal or external components of the radio frequency package on package (PoP) circuit 104. In some configurations, the surface mount technology (SMT) components 182 may be made in a thin film process.

A second radio frequency package 108 on the radio frequency package on package (PoP) circuit 104 may also include various radio frequency components. The radio frequency components on the second radio frequency package 108 may be similar to those described above in with regard to the first radio frequency package 106. Furthermore, each of the radio frequency components described in connection with the second radio frequency package 108 may be implemented on the first radio frequency package 106. Therefore, each of the radio frequency components described herein may be interchangeable between the first radio frequency package 106 and the second radio frequency package 108.

The second radio frequency package 108 may also include one or more antenna switches 122. Where a wireless device 102 includes multiple antennas, the second radio frequency package 108 may include one or more corresponding antenna switches 122 for each antenna. The antenna switches 122 may be used to switch between different modes, such as receiving, transmitting, mapping, tracking or otherwise improving performance of the wireless device 102. One or more antenna switches 122 may also be used when switching between use of different antennas and/or coupling one or more antennas to various radio frequency components within the radio frequency package on package (PoP) circuit 104.

The second radio frequency package 108 may also include one or more power amplifiers 124. Each power amplifier 124 may be used to amplify one or more frequency bands of signals passing through the radio frequency package on package (PoP) circuit 104. Examples of power amplifiers 124 may include high gain power amplifiers, distributed gain power amplifiers, low gain power amplifiers or other types of power amplifiers 124 for amplifying a signal passing through the radio frequency package on package (PoP) circuit 104 and transmitting a signal from an antenna of the wireless device 102. Each of the power amplifiers 124 may be used in connection with front end circuitry for the wireless device 102.

The second radio frequency package 108 may also include surface mount technology (SMT) components 182b, including resistors 184b, capacitors 186b and inductors 188b. The surface mount technology (SMT) components 182b may be used to optimize the filters 110, low noise amplifiers (LNAs) 114 and other radio frequency components on the radio frequency package on package (PoP) circuit 104. The surface mount technology (SMT) components 182b may also be used to operate or interface with any internal or external components of the radio frequency package on package (PoP) circuit 104.

It may be noted that various configurations of passive and active radio frequency components, as well as other components, may be implemented on each of the first radio frequency package 106 and the second radio frequency package 108. Furthermore, not all of the radio frequency components are necessarily included in each configuration of the radio frequency package on package (PoP) circuit 104. In one example, the first radio frequency package 106 may include one or more switches 116 and the second radio frequency package 108 may include one or more duplexers 112 while neither of the radio frequency packages 106, 108 include a power amplifier 124. Other configurations of radio frequency components may be used. Some additional configurations are described in more detail below.

A variety of materials may be used as a base for the first radio frequency package 106 and the second radio frequency package 108. For example, each of the first radio frequency package and the second radio frequency package may include a substrate 120a-b. Each of the radio frequency components may be implemented on the substrate 120a-b through an etching, soldering or other process for implementing the radio frequency components on the first radio frequency package 106 and the second radio frequency package 108. The radio frequency components may also be implemented using other types of materials (i.e., using other materials for a base), including printed circuit boards (PCBs), radio frequency integrated circuits (RFICs), silicon wafers, ceramic substrates, extended wafer level packaging technologies or other materials on which front end circuitry may be implemented. As discussed above, some configurations may also include microelectromechanical system (MEMS) components implemented in the first radio frequency package 106 and/or the second radio frequency package 108.

Each of the radio frequency components on the first radio frequency package 106 and the second radio frequency package 108 may be housed within individual casings. A casing may also be referred to as a package, a chip or a system. A casing may typically protect and/or shield electrical components that are sold and/or placed into a larger circuit. One or more of the radio frequency components may be enclosed within a casing having external pins for coupling one or more of the radio frequency components housed within the casing to other radio frequency components on the radio frequency package on package (PoP) circuit 104. In some configurations, each of the casings for housing the radio frequency components may include multiple conductive pins for coupling the inputs and outputs of each of the radio frequency components to other radio frequency components via electrical paths on the substrate, die, printed circuit board (PCB), radio frequency integrated circuit (RFIC) or other surface.

Moreover, multiple radio frequency components may be included within a single casing. For example, some or all of the filters on the first radio frequency package 106 may be housed within a single casing. In some configurations, different types of radio frequency components may be housed within the same casing. For example, one or more switches 116 and low noise amplifiers (LNAs) 114 on the first radio frequency package 106 may be housed within a single casing. Moreover, while casings may enclose various radio frequency components, many passive structures, such as inductors, transformers, capacitors, resistors or other electromagnetic structures may be implemented directly in or on one or both of the substrates 120*a-b*.

Each of the first radio frequency package 106 and the second radio frequency package 108 may include one or more interconnects 118*a-b*. The interconnects 118*a-b* may be used to attach the first radio frequency package 106 to the second radio frequency package 108. The interconnects 118*a-b* may also be used to provide an electrical connection between radio frequency components on the first radio frequency package 106 and the second radio frequency package 108. Examples of interconnects 118*a-b* that may be used include soldering balls, vias and other materials that may connect the first radio frequency package 106 and the second radio frequency package 108. Further, any number of interconnects 118*a-b* may be used for connecting the radio frequency packages or for providing electrical connections between radio frequency components on different radio frequency packages 106, 108.

The first radio frequency package 106 may include multiple passive radio frequency components and/or active radio frequency components. In some configurations, all of the radio frequency components on the first radio frequency package 106 are passive radio frequency components, such as filters 110, switches 116, duplexers 112 or other components that are capable of operating without relying on a source of energy, such as a direct current (DC) power source. In some configurations, all of the radio frequency components on the second radio frequency package 108 are active radio frequency components, such as power amplifiers 124, transistors or other components that rely on a source of energy, such as a direct current (DC) power source. In one example of a radio frequency package on package (PoP) circuit 104, by separating the active radio frequency components on a first radio frequency package 106 from the passive radio frequency components on a second radio frequency package 108, the radio frequency package on package (PoP) circuit 104 may only be required to supply power to the second radio frequency package 108 (and not the first radio frequency package 106).

In another configuration, the second radio frequency package 108 may include primarily active radio frequency components (e.g., power amplifiers) and surface-mount technology (SMT) components 182*b* while the first radio frequency package 106 includes a combination of passive and active radio frequency components. For example, the first radio frequency package 106 may include one or more low noise amplifiers (LNAs) 114 together with filters 110, duplexers 112 and switches 116. The low noise amplifiers (LNAs) 114 may be used to tie different multiplexers (MUXes) together on the first radio frequency package 106.

The first radio frequency package 106 and the second radio frequency package 108 may be customized to compensate for additional factors, such as isolation, ground inductance or other factors that may degrade the quality of a signal passing through the radio frequency package on package (PoP) circuit 104. For example, radio frequency components on the first radio frequency package 106 may be designed or customized to reduce the effects of ground inductance.

For example, ground inductance may degrade the performance of radio frequency components, such as surface acoustic wave (SAW) filters, bulk acoustic wave (BAW) filters and other filters having a high quality (Q) factor. For example, surface acoustic wave (SAW) filters and bulk acoustic wave (BAW) filters may experience out-of-band isolation degradation when experiencing additional ground inductance due to effects of vertically stacking the first radio frequency package 106 and the second radio frequency package 108. Ground inductance may also increase the power consumption of active components, such as power amplifiers. The effects of ground inductance may be larger on the top radio frequency package than the bottom radio frequency package. Reducing the effects of ground inductance may be obtained by designing one or more filters 110 (e.g., surface acoustic wave (SAW) and bulk acoustic wave (BAW) filters) to tolerate additional ground inductance. For example, filters 110 such as a surface acoustic wave (SAW) filter or a bulk acoustic wave (BAW) filter may experience increased ground inductance when placed in the top radio frequency package (e.g., the first radio frequency package 106) than when placed in the bottom radio frequency package (e.g., the second radio frequency package 108). The filters 110 may be designed assuming the ground parasitics of the first radio frequency package 106 are in place (such as ground inductance) in order to achieve a desired frequency response of the filters 110. Further, other radio frequency components on the first radio frequency package 106 may be modified in order to compensate for the additional ground inductance of the first radio frequency package 106. This anticipation of ground inductance may reduce or eliminate out of band isolation degradation of filters 110 and other radio frequency components on the first radio frequency package 106.

In some configurations, certain types of power amplifiers 124 may be placed on the top radio frequency package (e.g., the first radio frequency package 106). For example, differential power amplifiers may be customized to tolerate the additional ground inductance of the top radio frequency package. Therefore, certain power amplifiers 124, such as differential power amplifiers, may be placed on the top radio frequency package with the filters 110 and other radio frequency components.

The bottom radio frequency package (e.g., the second radio frequency package 108) may include a variety of passive and active radio frequency components. For example, the second radio frequency package 108 may include one or more filters 110 in addition to power amplifiers 124 and other radio frequency components. In some configurations, these filters 110 may be placed on the second radio frequency package 108 without requiring compensation for additional ground inductance, in contrast to the filters 110 and other components on the first radio frequency package 106 (which require compensation for additional ground inductance).

The radio frequency package on package (PoP) circuit 104 may be designed to have a certain thickness. For example, the radio frequency package on package (PoP) circuit 104 may be designed to have a thickness of approximately 1 millimeter (mm) or less. The radio frequency components on the first radio frequency package 106 and/or the second radio frequency package 108 may be back-grinded in order to meet certain height requirements of the radio frequency package on package (PoP) circuit 104.

Certain radio frequency components may also be separated between radio frequency packages 106, 108 in order to accomplish a desired thickness of the radio frequency package on package (PoP) circuit 104. For example, a first radio frequency package 106 may include one or more filters 110 and surface mount technology (SMT) components 182 having a first thickness while the second radio frequency package 108 may include one or more power amplifiers and other radio frequency components that have a second thickness.

The different radio frequency packages 106, 108 may also be implemented using different types of material. For example, the radio frequency components on the first radio frequency package 106 may be implemented using a die of a certain thickness (e.g., 100 micrometers (μm)) while the radio frequency components on the second radio frequency package 108 are implemented using different materials having a different thickness from the die. Either of the radio frequency packages 106, 108 may be placed on the bottom or top package of the radio frequency package on package (PoP) circuit 104. Each of the first radio frequency package 106 and the second radio frequency package 108 may be designed to accomplish a desired thickness of the radio frequency package on package (PoP) circuit 104.

Another benefit of separating radio frequency components into a first radio frequency package 106 and a second radio frequency package 108 may be for manufacturing purpose, such as obtaining the first radio frequency package 106 from a first manufacturer and the second radio frequency package 108 from a second manufacturer. Using components from multiple manufacturers may allow for a wider variety of radio frequency components that can be implemented within the wireless device 102. Using different radio frequency components on the first radio frequency package 106 allows for selecting or creating different flavors of one or more first radio frequency packages 106 to address different customer and market requirements while the second radio frequency package 108 remains unchanged. Therefore, stacking different flavors of first radio frequency packages 106 on top of a second radio frequency package 108 may allow for addressing different market needs with a single second radio frequency package 108 within a radio frequency package on package (PoP) circuit 104 in the design of a wireless device 102. Further, stacking the first radio frequency package 106 and the second radio frequency package 108 in a radio frequency package on package (PoP) circuit 104 may result in a more condensed front end circuit on a wireless device 102. In other configurations, additional radio frequency packages (beyond the first radio frequency package 106 and the second radio frequency package 108) may be stacked in a vertical configuration. Additional radio frequency packages may include different radio frequency components from the first radio frequency package 106 and the second radio frequency package 108.

Implementing radio frequency components in a radio frequency package on package (PoP) circuit 104 within a wireless device 102 may include additional consideration for optimizing the performance of the radio frequency components. For example, where the top package is the first radio frequency package 106, duplexers 112 placed on the first radio frequency package 106 may experience increased ground (GND) parasitics when compared to a duplexer 112 on a non-package on package (PoP) circuit. Similar effects may take place for low noise amplifiers (LNAs) 114, switches 116, power amplifiers 124 and other radio frequency components. Therefore, in compensating for various effects of implementing radio frequency components on the radio frequency package on package (PoP) circuit 104, the radio frequency components may be modified/optimized for optimal electrical and/or thermal coupling between the radio frequency components. Further, some radio frequency components, such as surface acoustic wave (SAW) filters and bulk acoustic wave (BAW) filters, may need to comply with overall height requirements of the stacked packages when implemented in a radio frequency package on package (PoP) circuit 104. Height requirements may vary depending on specific wireless devices 102 or types of wireless devices 102. The size of the wireless device 102 (e.g., thickness of a phone) may lower or raise height requirements for radio frequency components on each of the packages.

Figure 2:
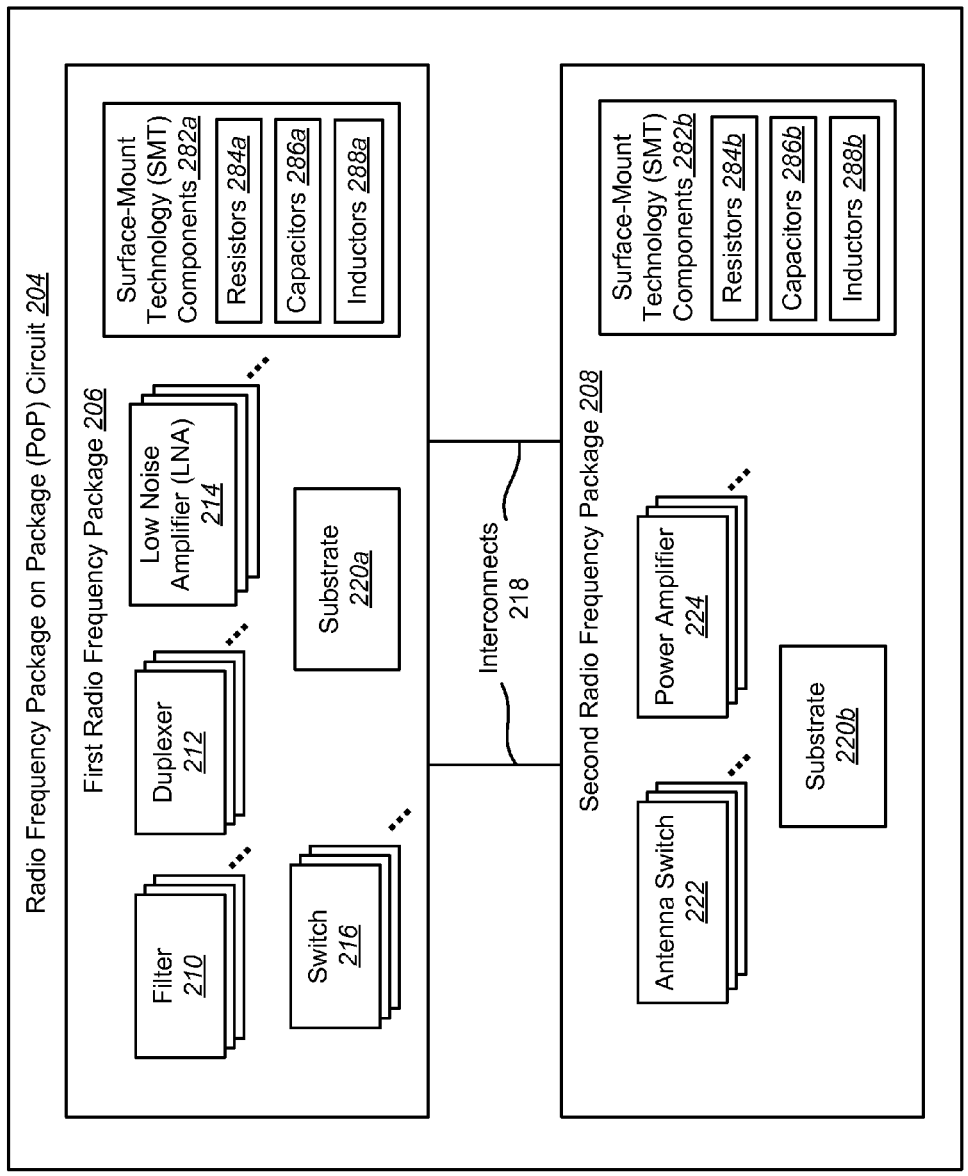
FIG. 2 is a block diagram illustrating a radio frequency package on package (PoP) circuit.

FIG. 2 is a block diagram illustrating a radio frequency package on package (PoP) circuit 204. The radio frequency package on package (PoP) circuit 204 of FIG. 2 is one configuration of the radio frequency package on package (PoP) circuit 104 described above in connection with FIG. 1. The radio frequency package on package (PoP) circuit 204 may be implemented as part of the front end circuitry of a wireless device 102. The radio frequency package on package (PoP) circuit 204 may include a first radio frequency package 206 and a second radio frequency package 208. The first radio frequency package 106 and the second radio frequency package 108 may be vertically oriented such that the first radio frequency package 106 is physically on top of the second radio frequency package 108. Alternatively, the second radio frequency package 108 may be on top of the first radio frequency package 106.

The first radio frequency package 206 may include various radio frequency components, including one or more filters 210, duplexers 212, low noise amplifiers (LNAs) 214 and switches 216. The first radio frequency package 206 may also include surface mount technology (SMT) components 282*a*, including resistors 284*a*, capacitors 286*a* and inductors 288*a*. Each of the radio frequency components may be implemented on a substrate 220*a* or other material. The second radio frequency package 208 may also include various radio frequency components, including one or more antenna switches 222 and power amplifiers 224. The second radio frequency package 208 may also include surface mount technology (SMT) components 282*b*, including resistors 284*b*, capacitors 286*b* and inductors 288*b*. Similar to the first radio frequency package 206, the radio frequency components on the second radio frequency package 208 may be implemented on a substrate 220*b* or other suitable base material. In some configurations, the first radio frequency package 206 includes passive radio frequency components while the second radio frequency package 208 includes active radio frequency components. Similar to the radio frequency components described above in connection with FIG. 1, any of the radio frequency components illustrated in FIG. 2 may be included on the first radio frequency package 206 and/or the second radio frequency package 208.

The first radio frequency package 206 may be coupled to the second radio frequency package 208 via one or more interconnects 218. The interconnects 218 may be on either or both surfaces of the first radio frequency package 206 and the second radio frequency package 208. The interconnects 218 may be used to attach the first radio frequency package 206 to the second radio frequency package 208. The interconnects 218 may also be used to provide an electrical connection between radio frequency components on the first radio frequency package 206 and radio frequency components on the second radio frequency package 208. Examples of types of interconnects 218 that may be used include soldering balls, vias and other materials that may connect the first radio frequency package 206 and the second radio frequency package 208. Any number of interconnects 218 may be used for connecting the radio frequency packages 206, 208 or for providing electrical connections between radio frequency components on different radio frequency packages 206, 208.

In one configuration, the interconnects 218 may include soldering balls. The soldering balls may be positioned between printed circuit boards (PCBs) corresponding to each of the first radio frequency package 206 and the second radio frequency package 208. Each of the first radio frequency package 206 and the second radio frequency package 208 may include solder mask layers with surface mount solder balls attached to the radio frequency packages 206, 208 via metal interconnect layers. Each of the soldering balls may be connected to a different node of the radio frequency package on package (PoP) circuit 204, providing different reference voltages accessible by different radio frequency components.

Where the first radio frequency package 206 and the second radio frequency package 208 include a silicon substrate or other semi-conductor medium, the interconnects 218 may use silicon vias to connect the first radio frequency package 206 to the second radio frequency package 208. Examples of silicon vias include a bridge via and a plug via. The vias used may also be implemented using whole via technology on both the first radio frequency package 206 and the second radio frequency package 208. Further, silicon vias (or other types of vias) may be implemented in a radio frequency package on package (PoP) circuit 204 that implements stacked dies. One benefit of a stacked die may include architectural and partitioning capabilities. Stacking dies may result in a higher package density, allowing for thin dies to be stacked on top of each other, removing the need for a wire bond. In this way, interconnects 218 may be as small as 2-6 microns, allowing for tighter package designs and a smaller size of the radio frequency package on package (PoP) circuit. Moreover, smaller interconnects 218 may result in shorter electrical paths, leading to improved performance.

Moreover, implementing radio frequency components on the radio frequency package on package (PoP) circuit 104 may also reduce routing area between radio frequency components where one or more interconnects 218 are inside the radio frequency packages 206, 208. Implementing the interconnects 218 within each of the first radio frequency package 206 and second radio frequency package 208 may allow for finer routing. Also, in order to minimize electrical trace losses on a printed circuit board (PCB) (e.g., phone PCB), many interconnects 218 may be routed as 50 Ohm impedance lines. The traces may consume more board area than other interconnects 218 and absorb the traces into the package to save area on each radio frequency package 206, 208. Since the traces inside the package are short and can be well controlled in shape and electrical behavior, absorbed radio frequency traces may not need to be routed as 50 Ohm lines within each radio frequency package 206, 208 (e.g., electrical behavior of traces can be compensated/matched inside the package) with reduced trace losses when compared to phone board routing.

Figure 3:
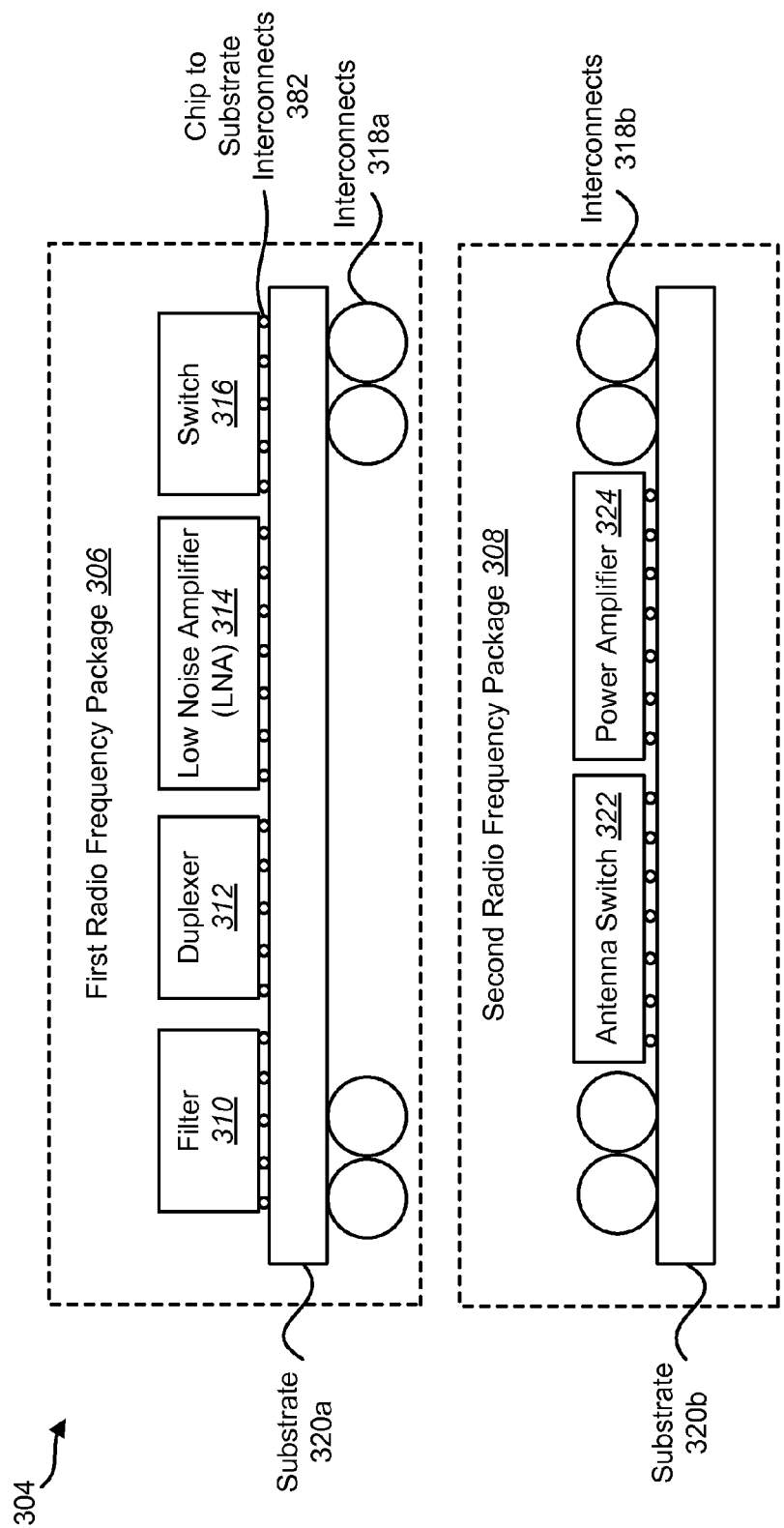
FIG. 3 is a side view of a radio frequency package on package (PoP) circuit.

FIG. 3 is a side view of a radio frequency package on package (PoP) circuit 304. The radio frequency package on package (PoP) circuit 304 may be one configuration of the radio frequency package on package (PoP) circuits 104, 204 described above in connection with FIG. 1 and FIG. 2. The radio frequency package on package (PoP) circuit 304 may be implemented as part of the front end circuitry of the wireless device 102. The radio frequency package on package (PoP) circuit 304 may include a first radio frequency package 306 and a second radio frequency package 308. The first radio frequency package 306 and the second radio frequency package 308 may be stacked in a vertical configuration.

The first radio frequency package 306 may include various radio frequency components, including one or more filters 310, duplexers 312, low noise amplifiers (LNAs) 314 and switches 316. Each of the radio frequency components may be implemented on a substrate 320a. Each of the radio frequency components may be attached to the substrate 320a using one or more chip to substrate interconnects 382. The second radio frequency package 308 may also include various radio frequency components, including one or more antenna switches 322 and power amplifiers 324. Similar to the first radio frequency package 306, the radio frequency components of the second radio frequency package 308 may be implemented on a substrate 320b using one or more chip to substrate interconnects 382.

Many different types of chip to substrate interconnects 382 (similar to the many types of interconnects 318) may be used. Examples of chip to substrate interconnects 382 that may be used include soldering balls, vias and other materials for connecting the radio frequency components to a substrate 320. In some configurations, the chip to substrate interconnects 382 are smaller than the interconnects 318 used for connecting the radio frequency packages 306, 308.

One or more of the radio frequency components on the first radio frequency package 306 and the second radio frequency package 308 may be enclosed within individual casings. The casings used for housing one or more radio frequency components may include multiple conductive pins for coupling the inputs and outputs for each of the radio frequency components to other radio frequency components within the radio frequency package on package (PoP) circuit 304. In some configurations, the conductive pins on each casing may be coupled to the substrate 320 using the chip to substrate interconnects 382. Separate casings may be used for each radio frequency component. Alternatively, different types of radio frequency components may be housed within the same casing. As an example, one or more low noise amplifiers (LNAs) 314 and switches 316 may be housed within a single casing. Furthermore, each of the radio frequency components described in connection with the first radio frequency package 306 and the second radio frequency package 308 may be implemented on either the first or second radio frequency package 306, 308. Therefore, each of the radio frequency components described herein may be interchangeable between the first radio frequency package 306 and the second radio frequency package 308.

In one configuration, the first radio frequency package 306 and the second radio frequency package 308 may be in a vertical configuration, with the first radio frequency package 306 positioned on top of the second radio frequency package 308. The first radio frequency package 306 may be connected to the second radio frequency package 308 via one or more interconnects 318a. The one or more filters 310, duplexers 312, low noise amplifiers (LNAs) 314 and switches 316 of the first radio frequency package 306 may be located above a top surface of the substrate 320a. One or more interconnects 318a may be located on the bottom surface of the substrate 320a of the first radio frequency package 306. The bottom surface of the substrate 320a of the first radio frequency package 306 may be facing the top surface of the substrate 320b of the second radio frequency package 308. The one or more antenna switches 322 and power amplifiers 324 of the second radio frequency package 308 may be placed on the top surface of the substrate 320b. The second radio frequency package 308 may also include one or more interconnects 318b on the top surface of the substrate 320b facing the first radio frequency package 306.

The vertical configuration of the radio frequency package on package (PoP) circuit 304 may be implemented by stacking the first radio frequency package 306 on top of the second radio frequency package 308. When stacking the packages in a vertical configuration, the interconnects 318a on the bottom surface of the first radio frequency package 306 may be configured such that they contact the interconnects 318b on the top surface of the second radio frequency package 308. Other configurations may include additional radio frequency packages stacked in a vertical configuration.

Figure 4:
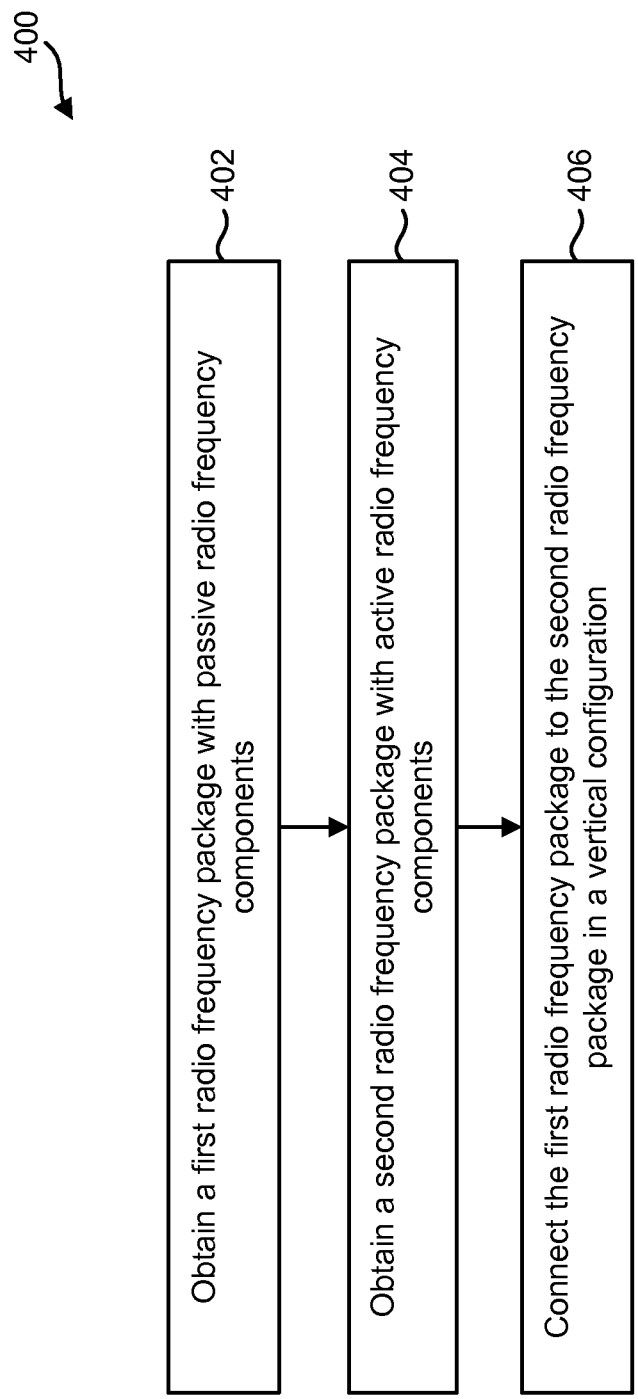
FIG. 4 is a flow diagram of a method for generating a radio frequency package on package (PoP) circuit.

FIG. 4 is a flow diagram of a method 400 for generating a radio frequency package on package (PoP) circuit 104. The method 400 may be performed by an engineer, technician or a computer. In one configuration, the method 400 may be performed by a fabrication machine.

A first radio frequency package 106 may be obtained 402. The first radio frequency package 106 may include passive radio frequency components. In some configurations, all of the radio frequency components on the first radio frequency package 106 are passive radio frequency components. A second radio frequency package 108 may also be obtained 404. The second radio frequency package 108 may include active radio frequency components. In some configurations, all of the radio frequency components on the second radio frequency package 108 are active radio frequency components. Further, the first radio frequency package 106 and the second radio frequency package 108 may each include a combination of active and passive radio frequency components.

The first radio frequency package 106 and the second radio frequency package 108 may be connected 406 in a vertical configuration. The bottom surface of the first radio frequency package 106 may be connected to the top surface of the second radio frequency package 108 via one or more interconnects 118. The various radio frequency components may be connected to the top surface of each of the first radio frequency package 106 and the second radio frequency package 108. The interconnects 118 on the bottom surface of the first radio frequency package 106 may connect to interconnects 118 on the top surface of the second radio frequency package 108. The radio frequency package on package (PoP) circuit 104 may also include additional packages stacked together in a vertical configuration.

In some configurations, the substrate 320a of the first radio frequency package 206, the substrate 320b of the second radio frequency package 208 and the radio frequency components on the second radio frequency package 208 may be assembled in a first step. The radio frequency components of the first radio frequency package 106 may be assembled in a second step.

Figure 5:
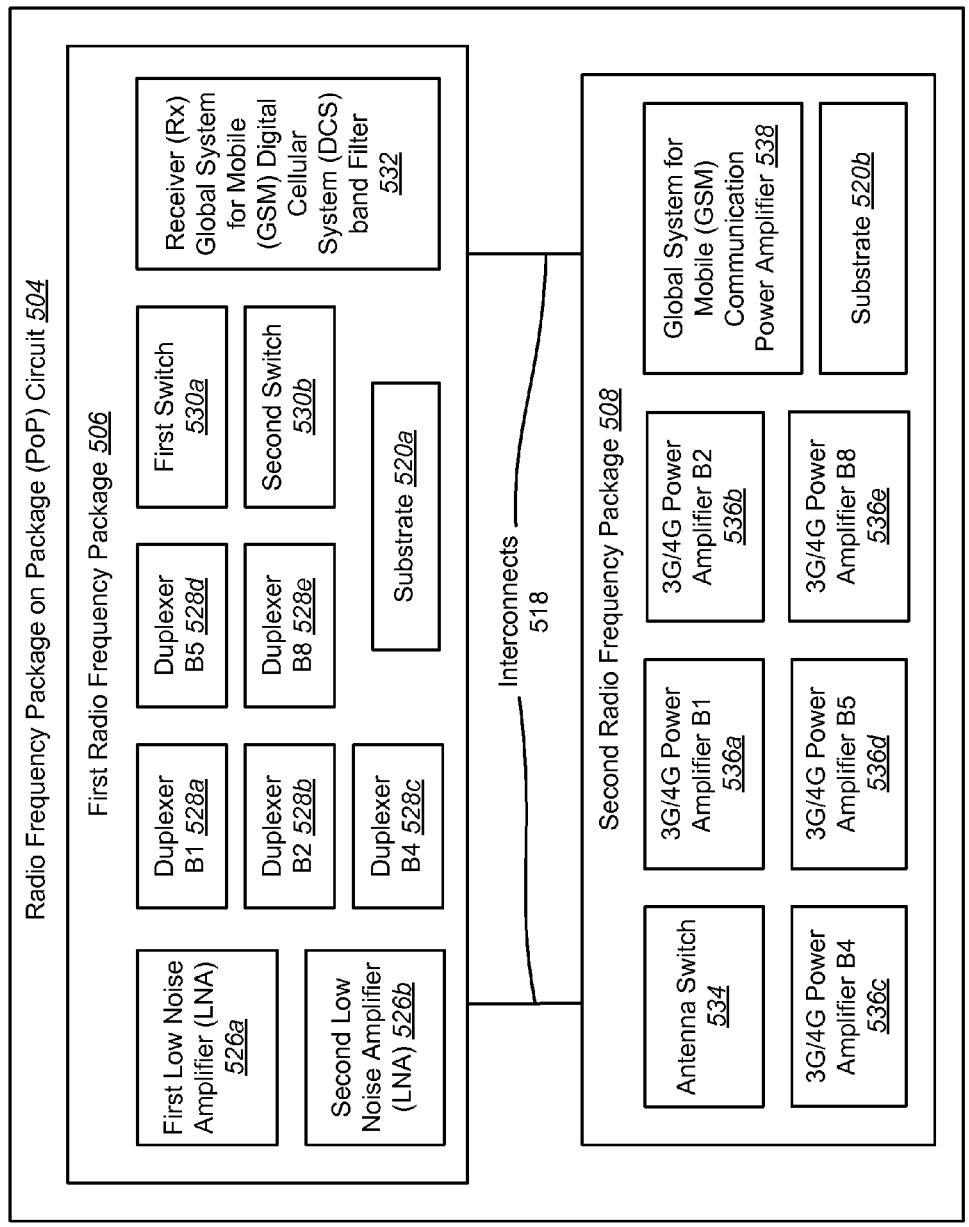
FIG. 5 is a block diagram illustrating one configuration of a radio frequency package on package (PoP) circuit.

FIG. 5 is a block diagram illustrating one configuration of a radio frequency package on package (PoP) circuit 504. The radio frequency package on package (PoP) circuit 504 of FIG. 5 may be one configuration of the radio frequency package on package (PoP) circuit 104, 204, 304 described above in connection with FIG. 1, FIG. 2 and FIG. 3. The radio frequency package on package (PoP) circuit 504 may be implemented as part of the front end circuitry of the wireless device 102. The radio frequency package on package (PoP) circuit 504 may include a first radio frequency package 506 and a second radio frequency package 508. The first radio frequency package 506 and the second radio frequency package 508 may be implemented in a vertical configuration.

The first radio frequency package 506 may include various radio frequency components. The first radio frequency package 506 may include a first low noise amplifier (LNA) 526a and a second low noise amplifier (LNA) 526b. The first radio frequency package 506 may also include a duplexer B1 528a, a duplexer B2 528b, a duplexer B4 528c, a duplexer B5 528d and a duplexer B8 528e. The first radio frequency package 506 may also include a first switch 530a and a second switch 530b. The first radio frequency package 506 may further include a receiver (Rx) global system for mobile (GSM) digital cellular system (DCS) band filter 532. Each of the radio frequency components of the first radio frequency package 506 may be implemented on a substrate 520a. The radio frequency components may also be implemented using other types of materials instead of a substrate 520a, including printed circuit boards (PCBs), radio frequency integrated circuits (RFICs), silicon wafers or another medium on which radio frequency components or front end circuitry may be implemented.

The second radio frequency package 508 may include various radio frequency components. For example, the second radio frequency package 508 may include an antenna switch 534. The second radio frequency package 508 may include a 3G/4G power amplifier B1 536a, a 3G/4G power amplifier B2 536b, a 3G/4G power amplifier B4 536c, a 3G/4G power amplifier B5 536d and a 3G/4G power amplifier B8 536e. The second radio frequency package 508 may also include a global system for mobile (GSM) communication power amplifier 538. Moreover, other types of systems may be used, in addition to global system for mobile (GSM), 3G and 4G systems. Examples of systems that may be supported may include frequency division duplex (FDD), time division duplex (TDD), half-duplex full division duplex (FDD) and half-duplex time division duplex (TDD) systems. Further, each of the radio frequency components on the second radio frequency package 508 may be implemented on a substrate 520b. The radio frequency components may also be deposited on other types of material instead of a substrate 520b, including printed circuit boards (PCBs), radio frequency integrated circuits (RFICs), silicon wafers, or another medium on which radio frequency components or front end circuitry may be implemented.

The first radio frequency package 506 and the second radio frequency package 508 may be connected via one or more interconnects 518 between surfaces of the radio frequency packages 506, 508. The interconnects 518 may also be used to provide an electrical connection between radio frequency components on the first radio frequency package 506 and radio frequency components on the second radio frequency package 508. Examples of types of interconnects 518 that may be used include soldering balls, vias and other materials that may connect the first radio frequency package 506 and the second radio frequency package 508. Further, any number of interconnects 518 may be used for connecting the radio frequency packages 506, 508 or for providing electrical connections between radio frequency components on different radio frequency packages 506, 508.

Figure 6:
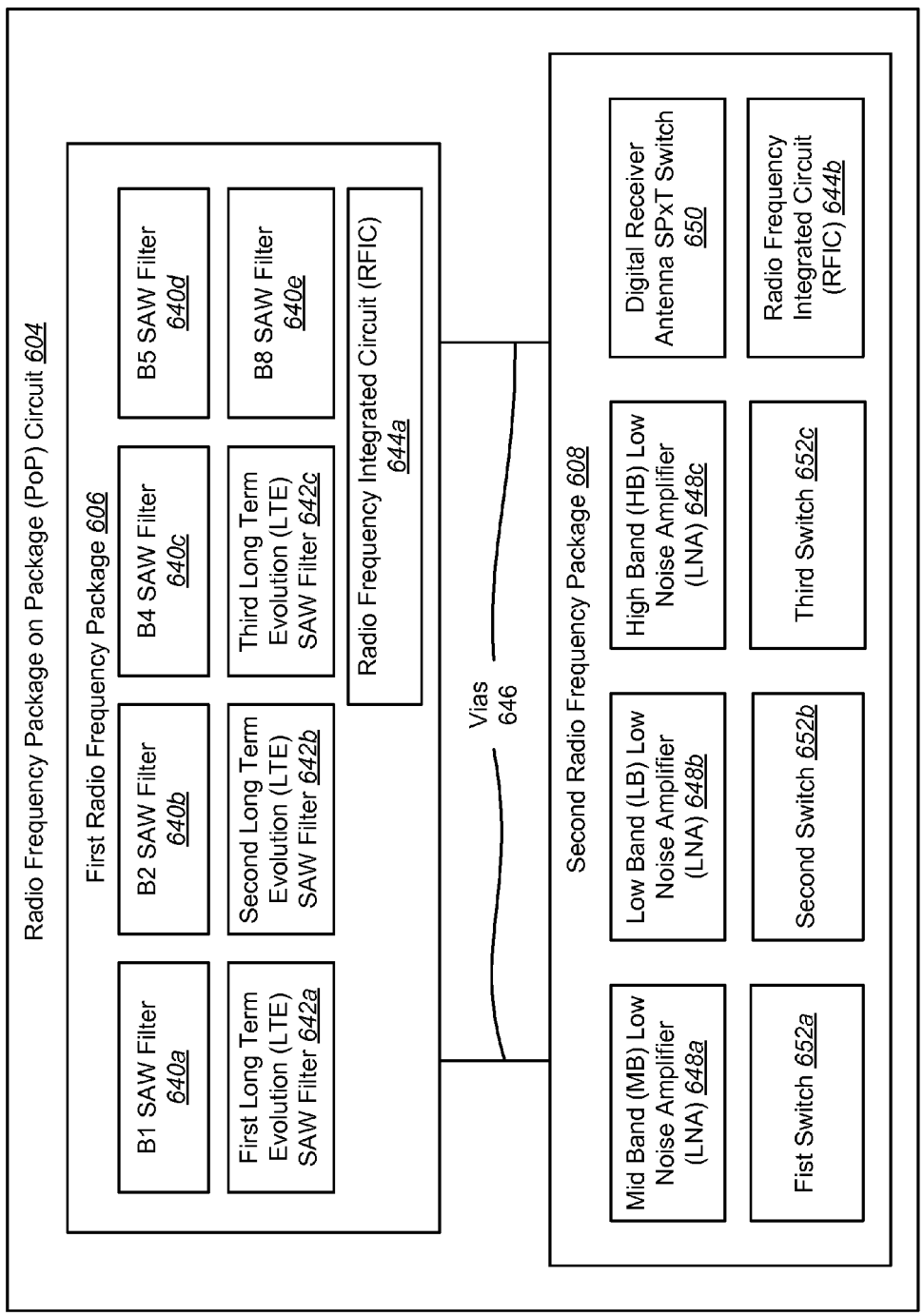
FIG. 6 is a block diagram illustrating another configuration of a radio frequency package on package (PoP) circuit.

FIG. 6 is a block diagram illustrating another configuration of a radio frequency package on package (PoP) circuit 604. The radio frequency package on package (PoP) circuit 604 of FIG. 6 may be one configuration of the radio frequency package on package (PoP) circuit 104, 204, 304 described above in connection with FIG. 1, FIG. 2 and FIG. 3. The radio frequency package on package (PoP) circuit 604 may be implemented as part of the front end circuitry of the wireless device 102. The radio frequency package on package (PoP) circuit 604 may include a first radio frequency package 606 and a second radio frequency package 608. The first radio frequency package 606 and the second radio frequency package 608 may be implemented in a vertical configuration.

The first radio frequency package 606 may include various radio frequency components. In one configuration, the first radio frequency package 606 may include multiple surface acoustic wave (SAW) filters 640a-e, 642a-c. For example, the first radio frequency package 606 may include a B1 surface acoustic wave (SAW) filter 640a, a B2 surface acoustic wave (SAW) filter 640b, a B4 surface acoustic wave (SAW) filter 640c, a B5 surface acoustic wave (SAW) filter 640d, a B8 surface acoustic wave (SAW) filter 640e, a first long term evolution (LTE) surface acoustic wave (SAW) filter 642a, a second long term evolution (LTE) surface acoustic wave (SAW) filter 642b and a third long term evolution (LTE) surface acoustic wave (SAW) filter 642c. Each of the surface acoustic wave (SAW) filters 640, 642 may be implemented on a radio frequency integrated circuit (RFIC) 644a. The surface acoustic wave (SAW) filters 640, 642 may also be implemented using other types of materials, including printed circuit boards (PCBs), silicon wafers, various substrates or another medium on which radio frequency components or front end circuitry may be implemented.

The second radio frequency package 608 may include various radio frequency components. In one configuration, the second radio frequency package 608 may include a first switch 652a, a second switch 652b and a third switch 652c. The second radio frequency package 608 may also include a midband (MB) low noise amplifier (LNA) 648a, a low band (LB) low noise amplifier (LNA) 648b and a high band (HB) low noise amplifier (LNA) 648c. The second radio frequency package 608 may also include a digital receiver antenna single pole multi throw (SPxT) switch 650. Each of the radio frequency components may be implemented on a radio frequency integrated circuit (RFIC) 644b. The radio frequency components may also be implemented on other types of material, including printed circuit boards (PCBs), silicon wafers, various substrates or another medium on which radio frequency components or front end circuitry may be implemented.

The first radio frequency package 606 and the second radio frequency package 608 may be connected to each other using one or more vias 646. The vias 646 may also be used to provide an electrical connection between radio frequency components on the first radio frequency package 606 and radio frequency components on the second radio frequency package 608. Other types of interconnects 118 may be used for connecting the first radio frequency package 606 and the second radio frequency package 608. Further, any number of vias 646 may be used in the radio frequency package on package (PoP) circuit 604.

Figure 7:
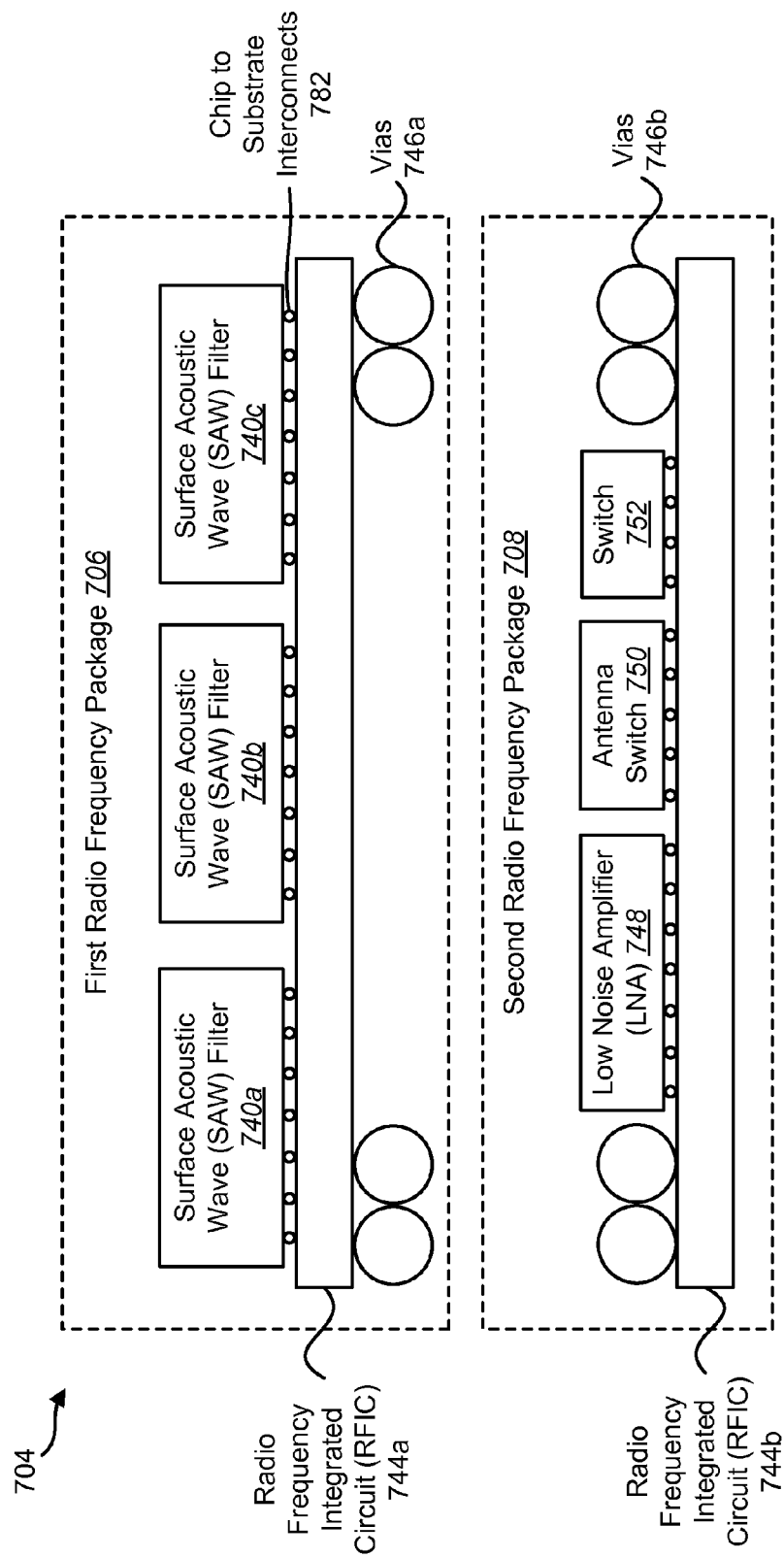
FIG. 7 is a side view of another configuration of a radio frequency package on package (PoP) circuit.

FIG. 7 is a side view of another configuration of a radio frequency package on package (PoP) circuit 704. The radio frequency package on package (PoP) circuit 704 of FIG. 7 may be one configuration of the radio frequency package on package (PoP) circuit 604 of FIG. 6. The radio frequency package on package (PoP) circuit 704 may be implemented as part of the front end circuitry of the wireless device 102. The radio frequency package on package (PoP) circuit 704 may include a first radio frequency package 706 and a second radio frequency package 708. The first radio frequency package 706 and the second radio frequency package 708 may be stacked in a vertical configuration.

The first radio frequency package 706 may include various radio frequency components, including multiple surface acoustic wave (SAW) filters 740a-c. In one configuration, all of the radio frequency components on the first radio frequency package 706 are surface acoustic wave (SAW) filters 740a-c. In other configurations, one or more other types of filters may be used, such as bandpass filters, tunable filters and/or bulk acoustic wave (BAW) filters. Each of the surface acoustic wave (SAW) filters 740a-c may be located on a radio frequency integrated circuit (RFIC) 744a. Each of the surface acoustic wave (SAW) filters and other radio frequency components may be connected to the radio frequency integrated circuit (RFIC) 744a using one or more chip to substrate interconnects 782. Additionally, one or more surface acoustic wave (SAW) filters 740 may be enclosed within individual casings. The casings may include conductive pins coupled to each of the surface acoustic wave (SAW) filters 740. The casings may be implemented on the radio frequency integrated circuit (RFIC) 744a.

The second radio frequency package 708 may include various radio frequency components, including one or more antenna switches 750, low noise amplifiers (LNAs) 748 and additional switches 752. Similar to the first radio frequency package 706, each of the radio frequency components in the second radio frequency package 708 may be located on a radio frequency integrated circuit (RFIC) 744b. Each of the radio frequency components on the second radio frequency package 708 may be connected to the radio frequency integrated circuit (RFIC) 744b using one or more chip to substrate interconnects 782. Additionally, one or more of the radio frequency components may be enclosed within individual casings. The casings may include conductive pins coupled to the radio frequency components enclosed within each casing. The casings may be implemented on the radio frequency integrated circuit (RFIC) 744b. Each casing may enclose one or more of the radio frequency components.

The first radio frequency package 706 and the second radio frequency package 708 may be connected to each other using one or more vias 746a-b. Examples of vias 746 may include a bridge via and a plug via. In one configuration, the vias 746a-b may be silicon vias. The radio frequency integrated circuit (RFIC) 744a of the first radio frequency package 706 and the radio frequency integrated circuit (RFIC) 744b of the second radio frequency package 708 may each implement stacked dies with vias 746a-b for connecting the radio frequency components of the first radio frequency package 706 to the radio frequency components of the second radio frequency package 708.

Figure 8:
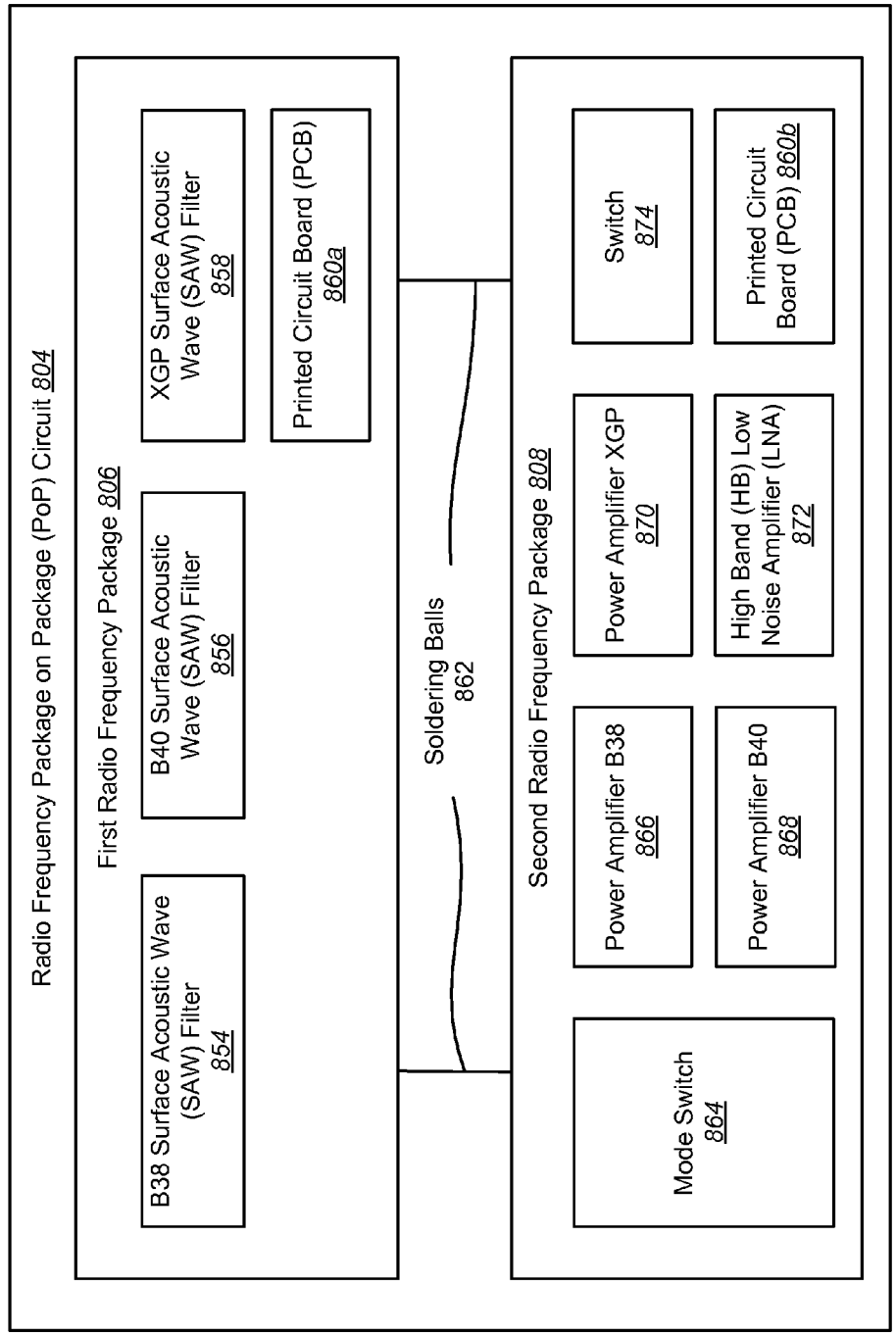
FIG. 8 is a block diagram illustrating yet another configuration of a radio frequency package on package (PoP) circuit.

FIG. 8 is a block diagram illustrating yet another configuration of a radio frequency package on package (PoP) circuit 804. The radio frequency package on package (PoP) circuit 804 of FIG. 8 may be one configuration of the radio frequency package on package (PoP) circuit 104, 204, 304 described above in connection with FIG. 1, FIG. 2 and FIG. 3. The radio frequency package on package (PoP) circuit 804 may be implemented as part of the front end circuitry of the wireless device 102. The radio frequency package on package (PoP) circuit 804 may include a first radio frequency package 806 and a second radio frequency package 808. The first radio frequency package 806 and the second radio frequency package 808 may be implemented in a vertical configuration.

The first radio frequency package 806 may include various radio frequency components. For example, the first radio frequency package 806 may include multiple surface acoustic wave (SAW) filters 854, 856, 858. For example, the first radio frequency package 806 may include a B38 surface acoustic wave (SAW) filter 854, a B40 surface acoustic wave (SAW) filter 856 and an extended global platform (XGP) surface acoustic wave (SAW) filter 858. The extended global platform (XGP) may refer to a Japanese frequency band which is a subset of the band B41. Each of the surface acoustic wave (SAW) filters 854, 856, 858 may be implemented on a printed circuit board (PCB) 860a. The radio frequency components may also be implemented using other types of materials, including radio frequency integrated circuits (RFIC), silicon wafers, various substrates or another medium on which radio frequency components or front end circuitry may be implemented.

The second radio frequency package 808 may include various radio frequency components. For example, the second radio frequency package 808 may include a mode switch 864. The second radio frequency package 808 may also include multiple power amplifiers 866, 868, 870. For example, the second radio frequency package 808 may include a power amplifier B38 866, a power amplifier B40 868 and a power amplifier extended global platform (XGP) 870. The second radio frequency package 808 may also include a high band (HB) low noise amplifier (LNA) 872 and a switch 874. Each of the radio frequency components may be implemented on a printed circuit board (PCB) 860b. The radio frequency components may also be implemented on other types of material, including radio frequency integrated circuits (RFIC), silicon wafers, various substrates or another medium on which radio frequency components or front end circuitry may be implemented.

The first radio frequency package 806 and the second radio frequency package 808 may be connected to each other using one or more soldering balls 862 on the surfaces of the printed circuit boards (PCBs) 860a-b. In one configuration, each of the first radio frequency package 806 and the second radio frequency package 808 may include solder mask layers with surface mount soldering balls 862 attached to the radio frequency packages 806, 808 via metal interconnect layers. Each of the soldering balls 862 may be connected to different nodes of the radio frequency package on package (PoP) circuit 804. The soldering balls 862 may also be used to provide an electrical connection between radio frequency components on the first radio frequency package 806 and the second radio frequency package 808. Any number of soldering balls 862 may be used in the radio frequency package on package (PoP) circuit 804. Further, other types of interconnects 118 may be used for connecting the first radio frequency package 806 and the second radio frequency package 808.

Figure 9:
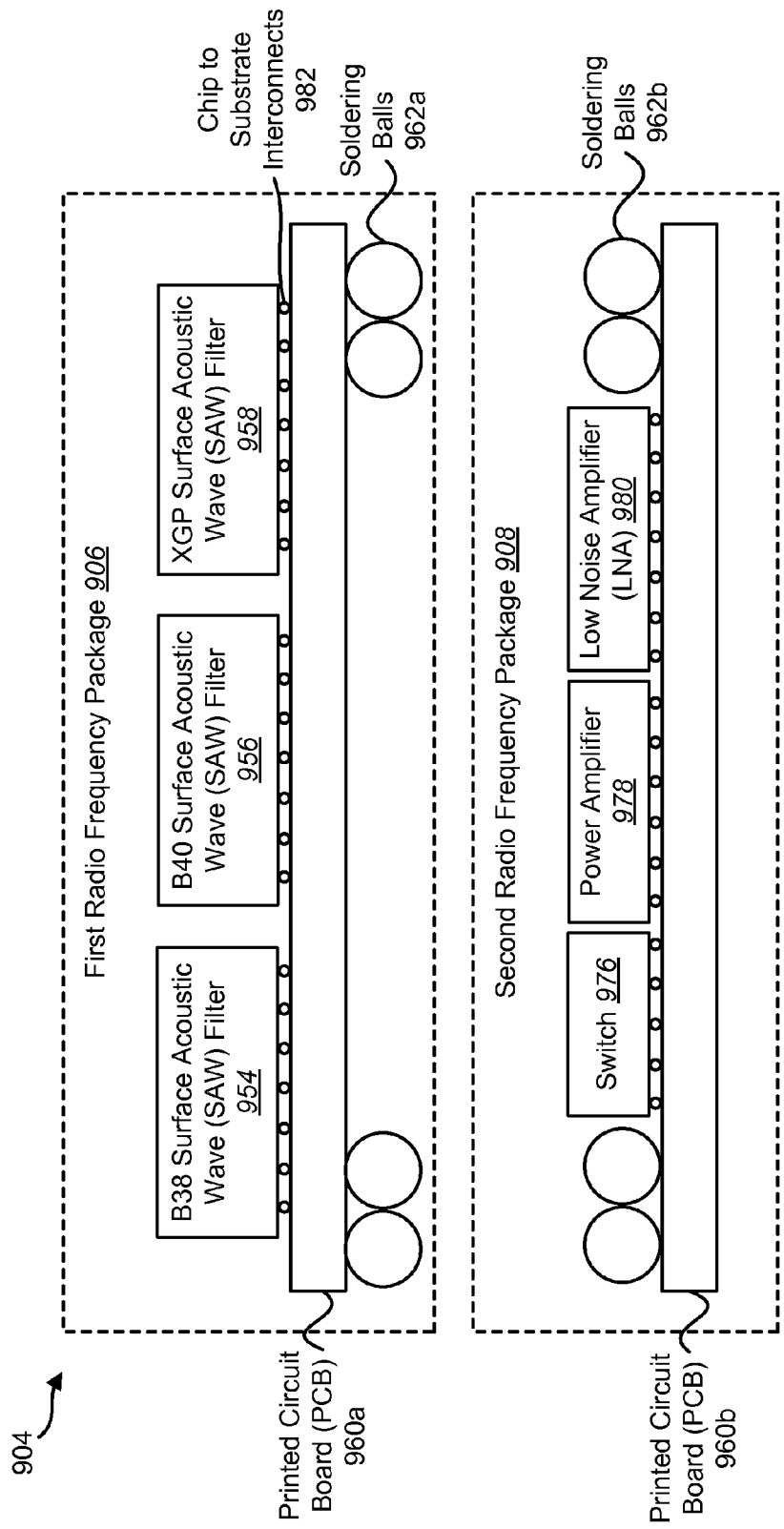
FIG. 9 is a side view of still yet another configuration of a radio frequency package on package (PoP) circuit.

FIG. 9 is a side view of yet another configuration of a radio frequency package on package (PoP) circuit 904. The radio frequency package on package (PoP) circuit 904 of FIG. 9 may be one configuration of the radio frequency package on package (PoP) circuit 804 of FIG. 8. The radio frequency package on package (PoP) circuit 904 may be implemented as part of the front end circuitry of the wireless device 102. The radio frequency package on package (PoP) circuit 904 may include a first radio frequency package 906 and a second radio frequency package 908. The first radio frequency package 906 and the second radio frequency package 908 may be stacked in a vertical configuration.

The first radio frequency package 906 may include various radio frequency components, including multiple surface acoustic wave (SAW) filters 954, 956, 958. In one configuration, the first radio frequency package 906 includes a B38 surface acoustic wave (SAW) filter 954, a B40 surface acoustic wave (SAW) filter 956 and an extended global platform (XGP) surface acoustic wave (SAW) filter 958. Each of the surface acoustic wave (SAW) filters 954, 956, 958 may be implemented on a printed circuit board (PCB) 960a. Each of the surface acoustic wave (SAW) filters 954, 956, 958 may be also connected to the printed circuit board (PCB) 960a using one or more chip to substrate interconnects 982. Additionally, one or more surface acoustic wave (SAW) filters 954, 956, 958 may be enclosed within individual casings. The casings may include conductive pins coupled to each of the surface acoustic wave (SAW) filters 954, 956, 958. The casings may be implemented on the printed circuit board (PCB) 960a. Each casing may enclose one or more surface acoustic wave (SAW) filters 954, 956, 958.

The second radio frequency package 908 may include various frequency components, including one or more switches 976, power amplifiers 978 and low noise amplifiers (LNAs) 980. Similar to the first radio frequency package 906, each of the radio frequency components may be deposited on a printed circuit board (PCB) 960b. Each of the radio frequency components may also be connected to the printed circuit board 960b using one or more chip to substrate interconnects 982. Additionally, one or more of the radio frequency components may be enclosed within individual casings. The casings may include conductive pins coupled to the radio frequency components within each casing. The casings may be implemented on the printed circuit board (PCB) 960b. Each casing may enclose one or more of the radio frequency components.

The first radio frequency package 906 and the second radio frequency package 908 may be connected by way of one or more soldering balls 962a-b. In one configuration, each of the first radio frequency package 906 and the second radio frequency package 908 may include solder mask layers with surface mount soldering balls 962a-b attached to the radio frequency packages 906, 908 via metal interconnect layers. Each of the soldering balls 962a-b may be connected to a different node of the radio frequency package on package (PoP) circuit 904. The soldering balls 962a-b may also be used to provide an electrical connection between radio frequency components on the first radio frequency package 906 and the second radio frequency package 908. Further, other types of interconnects 118 may be used for connecting the first radio frequency package 906 and the second radio frequency package 908.

Figure 10:
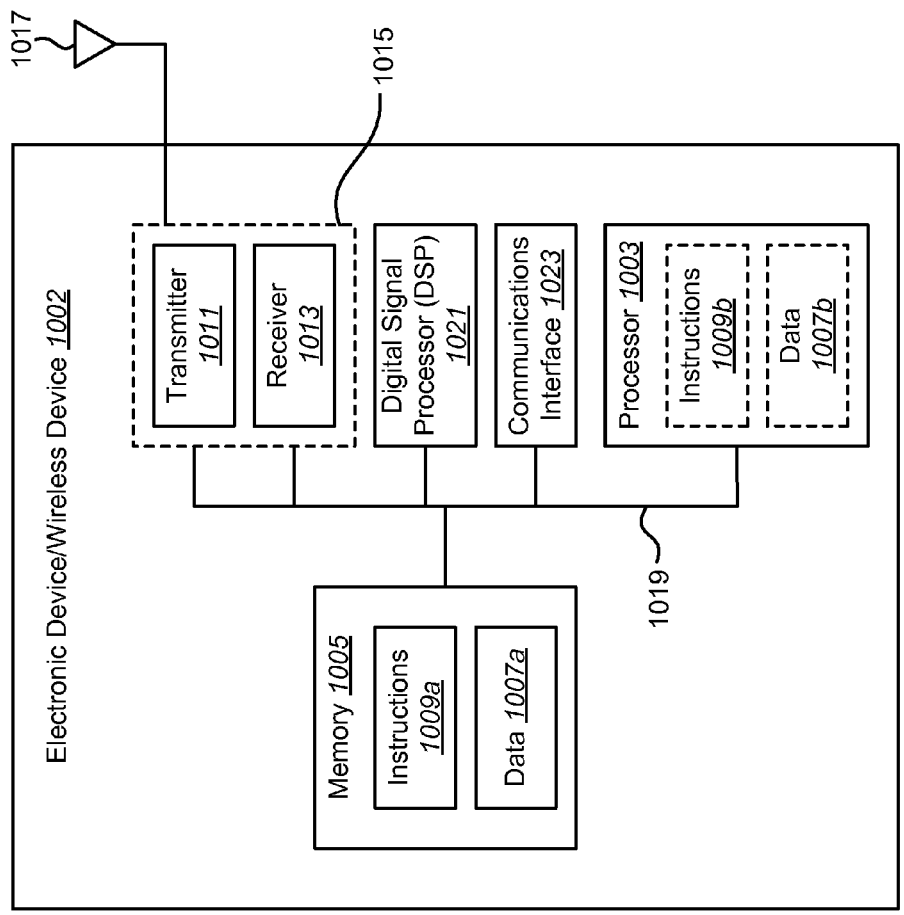
FIG. 10 illustrates certain components that may be included within an electronic device/wireless device.

FIG. 10 illustrates certain components that may be included within an electronic device/wireless device 1002. The electronic device/wireless device 1002 may be an access terminal, a mobile station, a user equipment (UE), etc. The electronic device/wireless device 1002 includes a processor 1003. The processor 1003 may be a general purpose single- or multi-chip microprocessor (e.g., an ARM), a special purpose microprocessor (e.g., a digital signal processor (DSP)), a microcontroller, a programmable gate array, etc. The processor 1003 may be referred to as a central processing unit (CPU). Although just a single processor 1003 is shown in the electronic device/wireless device 1002 of FIG. 10, in an alternative configuration, a combination of processors (e.g., an ARM and DSP) could be used.

The electronic device/wireless device 1002 also includes memory 1005. The memory 1005 may be any electronic component capable of storing electronic information. The memory 1005 may be embodied as random access memory (RAM), read-only memory (ROM), magnetic disk storage media, optical storage media, flash memory devices in RAM, on-board memory included with the processor, erasable programmable read-only memory (EPROM), electrically erasable PROM (EEPROM), registers and so forth, including combinations thereof.

Data 1007a and instructions 1009a may be stored in the memory 1005. The instructions 1009a may be executable by the processor 1003 to implement the methods disclosed herein. Executing the instructions 1009a may involve the use of the data 1007a that is stored in the memory 1005. When the processor 1003 executes the instructions 1009, various portions of the instructions 1009b may be loaded onto the processor 1003, and various pieces of data 1007b may be loaded onto the processor 1003.

The electronic device/wireless device 1002 may also include a transmitter 1011 and a receiver 1013 to allow transmission and reception of signals to and from the electronic device/wireless device 1002 via an antenna 1017. The transmitter 1011 and receiver 1013 may be collectively referred to as a transceiver 1015. The electronic device/wireless device 1002 may also include (not shown) multiple transmitters, multiple antennas, multiple receivers and/or multiple transceivers.

The electronic device/wireless device 1002 may include a digital signal processor (DSP) 1021. The electronic device/wireless device 1002 may also include a communications interface 1023. The communications interface 1023 may allow a user to interact with the electronic device/wireless device 1002.

The various components of the electronic device/wireless device 1002 may be coupled together by one or more buses, which may include a power bus, a control signal bus, a status signal bus, a data bus, etc. For the sake of clarity, the various buses are illustrated in FIG. 10 as a bus system 1019.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio and microwave, then the coaxial cable, fiber optic cable, twisted pair, DSL, or wireless technologies such as infrared, radio and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 4, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods and apparatus described herein without departing from the scope of the claims.

What is claimed is:

1. A radio frequency package on package circuit comprising:
   a first radio frequency package comprising radio frequency components; and
   a second radio frequency package comprising radio frequency components, wherein the first radio frequency package and the second radio frequency package are in a vertical configuration with the first radio frequency package positioned on top of the second radio frequency package, and wherein the radio frequency components on the first radio frequency package are designed to compensate for the first radio frequency package experiencing greater ground inductance than the second radio frequency package.

2. The radio frequency package on package circuit of claim 1, wherein the first radio frequency package comprises passive radio frequency components.

3. The radio frequency package on package circuit of claim 1, wherein the second radio frequency package comprises active radio frequency components.

4. The radio frequency package on package circuit of claim 1, wherein each of the radio frequency components on the first radio frequency package are passive radio frequency components.

5. The radio frequency package on package circuit of claim 1, wherein each of the radio frequency components on the second radio frequency package are active radio frequency components.

6. The radio frequency package on package circuit of claim 1, wherein the first radio frequency package comprises active radio frequency components.

7. The radio frequency package on package circuit of claim 1, wherein the second radio frequency package comprises passive radio frequency components.

8. The radio frequency package on package circuit of claim 1, wherein each of the radio frequency components on the first radio frequency package are active radio frequency components.

9. The radio frequency package on package circuit of claim 1, wherein each of the radio frequency components on the second radio frequency package are passive radio frequency components.

10. The radio frequency package on package circuit of claim 1, wherein the radio frequency package on package circuit is implemented in a front end circuit of a wireless device.

11. The radio frequency package on package circuit of claim 1, wherein the radio frequency components on the first radio frequency package and the second radio frequency package are designed according to a desired thickness of the radio frequency package on package circuit.

12. The radio frequency package on package circuit of claim 11, wherein the desired thickness is equal to or less than 1 millimeter.

13. The radio frequency package on package circuit of claim 11, wherein back grinding is performed on one or more of the radio frequency components of one of the first radio frequency package and the second radio frequency package according to the desired thickness of the radio frequency package on package circuit.

14. The radio frequency package on package circuit of claim 1, wherein the first radio frequency package comprises one or more filters, and wherein the second radio frequency package comprises one or more power amplifiers.

15. The radio frequency package on package circuit of claim 14, wherein at least one of the filters is a surface acoustic wave filter.

16. The radio frequency package on package circuit of claim 14, wherein at least one of the filters is a bulk acoustic wave filter.

17. The radio frequency package on package circuit of claim 1, wherein the first radio frequency package comprises one or more power amplifiers, and wherein the second radio frequency package comprises one or more filters.

18. The radio frequency package on package circuit of claim 17, wherein at least one of the filters is a surface acoustic wave filter.

19. The radio frequency package on package circuit of claim 17, wherein at least one of the filters is a bulk acoustic wave filter.

20. The radio frequency package on package circuit of claim 1, wherein the first radio frequency package and the second radio frequency package are coupled using multiple interconnects.

21. The radio frequency package on package circuit of claim 20, wherein the multiple interconnects comprise soldering balls.

22. The radio frequency package on package circuit of claim 20, wherein the multiple interconnects comprise vias.

23. The radio frequency package on package circuit of claim 20, wherein at least one radio frequency component on the first radio frequency package is electrically coupled to at least one radio frequency component on the second radio frequency package via the multiple interconnects.

24. The radio frequency package on package circuit of claim 1, wherein the first radio frequency package comprises one or more filters, duplexers, low noise amplifiers and switches.

25. The radio frequency package on package circuit of claim 24, wherein the second radio frequency package comprises one or more antenna switches and power amplifiers.

26. A method of generating a radio frequency package on package circuit, comprising:
   obtaining a first radio frequency package that comprises radio frequency components;
   obtaining a second radio frequency package that comprises radio frequency components, wherein the radio frequency components on the first radio frequency package are designed to compensate for the first radio frequency package experiencing greater ground inductance than the second radio frequency package; and
   connecting the first radio frequency package to the second radio frequency package in a vertical configuration with the first radio frequency package positioned on top of the second radio frequency package.

27. The method of claim 26, wherein the first radio frequency package comprises passive radio frequency components.

28. The method of claim 26, wherein the second radio frequency package comprises active radio frequency components.

29. The method of claim 26, wherein each of the radio frequency components on the first radio frequency package are passive radio frequency components.

30. The method of claim 26, wherein each of the radio frequency components on the second radio frequency package are active radio frequency components.

31. The method of claim 26, wherein the first radio frequency package comprises active radio frequency components.

32. The method of claim 26, wherein the second radio frequency package comprises passive radio frequency components.

33. The method of claim 26, wherein each of the radio frequency components on the first radio frequency package are active radio frequency components.

34. The method of claim 26, wherein each of the radio frequency components on the second radio frequency package are passive radio frequency components.

35. The method of claim 26, further comprising implementing the radio frequency package on package circuit in a front end circuit of a wireless device.

36. The method of claim 26, wherein the radio frequency components on the first radio frequency package and the second radio frequency package are designed to meet a desired thickness of the radio frequency package on package circuit.

37. The method of claim 26, wherein designing the radio frequency components on the first radio frequency package and the second radio frequency package comprises back grinding one or more of the radio frequency components on one of the first radio frequency package and the second radio frequency package according to the desired thickness of the radio frequency package on package circuit.

38. The method of claim 26, wherein the first radio frequency package comprises one or more filters, and wherein the second radio frequency package comprises one or more power amplifiers.

39. The method of claim 26, wherein the first radio frequency package comprises one or more power amplifiers, and wherein the second radio frequency package comprises on or more filters.

40. The method of claim 26, wherein the first radio frequency package is connected to the second radio frequency package using multiple interconnects.

41. The method of claim 40, wherein the multiple interconnects comprise soldering balls.

42. The method of claim 40, wherein the multiple interconnects comprise vias.

43. The method of claim 40, wherein at least one radio frequency component on the first radio frequency package is electrically coupled to at least one radio frequency component on the second radio frequency package via the multiple interconnects.

44. The method of claim 26, wherein the first radio frequency package comprises one or more filters, duplexers, low noise amplifiers and switches.

45. The method of claim 44, wherein the second radio frequency package comprises one or more antenna switches and power amplifiers.

46. An apparatus for generating a radio frequency package on package circuit, comprising:
    means for obtaining a first radio frequency package that comprises radio frequency components;
    means for obtaining a second radio frequency package that comprises radio frequency components, wherein the radio frequency components on the first radio frequency package are designed to compensate for the first radio frequency package experiencing greater ground inductance than the second radio frequency package; and
    means for connecting the first radio frequency package to the second radio frequency package in a vertical configuration with the first radio frequency package positioned on top of the second radio frequency package.

47. The apparatus of claim 46, wherein the first radio frequency package comprises passive radio frequency components.

48. The apparatus of claim 46, wherein the second radio frequency package comprises active radio frequency components.

49. The apparatus of claim 46, further comprising means for implementing the radio frequency package on package circuit in a front end circuit of a wireless device.

50. A computer-program product for generating a radio frequency package on package circuit, the computer-program product comprising a non-transitory computer-readable medium having instructions thereon, the instructions comprising:
    code for causing an apparatus to obtain a first radio frequency package that comprises radio frequency components;
    code for causing the apparatus to obtain a second radio frequency package that comprises radio frequency components, wherein the radio frequency components on the first radio frequency package are designed to compensate for the first radio frequency package experiencing greater ground inductance than the second radio frequency package; and
    code for causing the apparatus to connect the first radio frequency package to the second radio frequency package in a vertical configuration with the first radio frequency package positioned on top of the second radio frequency package.

51. The computer-program product of claim 50, wherein the first radio frequency package comprises passive radio frequency components.

52. The computer-program product of claim 50, wherein the second radio frequency package comprises active radio frequency components.

53. The computer-program product of claim 50, wherein the instructions further comprise code for causing the apparatus to implement the radio frequency package on package circuit in a front end circuit of a wireless device.

* * * * *